(12) United States Patent
Bakulin et al.

(10) Patent No.: US 6,927,957 B1
(45) Date of Patent: Aug. 9, 2005

(54) ELECTROSTATIC DISCHARGE CLAMP

(75) Inventors: Alex S. Bakulin, Huntington Beach, CA (US); Eugene R. Worley, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 193 days.

(21) Appl. No.: 10/199,750

(22) Filed: Jul. 18, 2002

(51) Int. Cl.$^7$ ............................................... H02H 9/00
(52) U.S. Cl. ................................................. 361/56
(58) Field of Search ....................... 361/111, 56, 95; 257/378

(56) References Cited

U.S. PATENT DOCUMENTS

| | | | | |
|---|---|---|---|---|
| 5,440,162 A | | 8/1995 | Worley et al. | 257/332 |
| 5,500,546 A | * | 3/1996 | Marum et al. | 257/358 |
| 5,654,862 A | * | 8/1997 | Worley et al. | 361/111 |
| 5,726,844 A | * | 3/1998 | Smith | 361/56 |
| 5,946,177 A | * | 8/1999 | Miller et al. | 361/56 |
| 5,978,192 A | * | 11/1999 | Young et al. | 361/56 |
| 6,400,540 B1 | * | 6/2002 | Chang | 361/56 |
| 6,455,902 B1 | * | 9/2002 | Voldman | 257/378 |

* cited by examiner

*Primary Examiner*—Brian Sircus
*Assistant Examiner*—Boris Benenson
(74) *Attorney, Agent, or Firm*—Farjami & Farjami LLP

(57) ABSTRACT

According to one exemplary embodiment, an ESD bus clamp in an integrated circuit comprises an inverter having an input and an output. The ESD bus clamp further comprises a bipolar transistor having a base, an emitter, and a collector, where the base is connected to the output of the inverter, the emitter is connected to a ground of the integrated circuit, and the collector is connected to a power bus of the integrated circuit. The bipolar transistor, for example, may be an NPN bipolar transistor and may begin shunting current to the ground when an ESD discharge causes a voltage level on the power bus to increase by approximately 1.0 volt. According to this exemplary embodiment, the ESD bus clamp further comprises a resistor coupling the input of the inverter to the power bus. The ESD bus clamp further comprises a capacitor coupling the input of the inverter to ground.

24 Claims, 3 Drawing Sheets

ELECTROSTATIC DISCHARGE CLAMP

BACKGROUND OF THE INVENTION

1. Field of the Invention

The present invention is generally in the field of fabrication of semiconductor devices. More particularly, the present invention is in the field of fabrication of electrostatic discharge ("ESD") protection devices for integrated circuits.

2. Related Art

Continued advances in semiconductor technology have resulted in integrated circuits ("IC") with smaller and smaller geometries. As the devices become more miniaturized, however, they become more susceptible to electrostatic discharge ("ESD") damages. By way of background, ESD is a relatively rapid, high-current event resulting from high voltage created when electrostatic charges are rapidly transferred between bodies at different electrical potentials. If not properly contained, ESD discharge can lead to either a reduction in IC performance, e.g. increased leakage current on one or more pins of the IC, or total circuit failure. Consequently, ESD discharge can result in an undesirable increase in the overall manufacturing cost of IC chips.

In an attempt to minimize the effect of ESD discharge, semiconductor manufacturers have fabricated protection devices for the input and output ("I/O") pads of ICs to absorb the sudden surge of ESD discharge. In one conventional approach, snapback devices, such as open-base NPN transistors, are utilized to provide ESD protection to the I/O pads of ICs. While snapback devices offer ESD protection, they also add undesirable capacitive loads to the I/O pads.

To reduce the capacitive load cause by snapback devices, semiconductor manufacturers employ reverse-biased substrate diodes connected between the I/O pad and the substrate and reverse-biased N-well diodes connected between the Vcc bus and the I/O pad. The substrate diodes protect against a negative ESD discharge by providing a low resistance current path to the substrate to dissipate the negative electrostatic charge, and the N-well diodes protect against a positive ESD discharge by providing a low resistance current path to the Vcc bus to dissipate the positive electrostatic charge. However, the Vcc bus cannot effectively dissipate the positive electrostatic charge. As a result, a Vcc to ground clamp is required to provide a low resistance current shunt path to ground to dissipate the positive electrostatic charge.

One approach utilizes a threshold clamp to provide a current shunt path from the Vcc bus to ground to dissipate the positive electrostatic charge on the Vcc bus. The threshold clamp is activated and starts conducting current when the positive electrostatic charge on the Vcc bus exceeds a threshold voltage, which is typically approximately 7.0 volts. However, a 7.0 volt trigger voltage may be undesirably high for some circuits and, as a result, those circuits can be damaged by the positive electrostatic charge before the threshold clamp turns on and begins shunting current to ground. Also, if the power supply voltage on the Vcc bus exceeds a normal level, the threshold clamp may turn on or partially turn on, resulting in an undesirable current leak through the threshold clamp.

Another approach utilizes a transient clamp to provide a current shunt path from the Vcc bus to ground. The transient clamp turns on and begins conducting at a lower voltage than the threshold clamp, and thus provides a more effective current shunt path than the threshold clamp. The transient clamp utilizes an NFET (N-channel Field Effect Transistor) to shunt current from the Vcc bus to ground. However the NFET consumes a large area in the IC chip and has a low current rating. An example of the above transient clamp is disclosed in U.S. Pat. No. 5,440,162, issued on Aug. 8, 1995, titled "ESD Protection for Submicron CMOS Circuits."

Thus, there is thus a need in the art for an improved ESD bus clamp. In particular, there is a need in the art for an improved ESD bus clamp having a high current rating, a small size, and a sufficiently low trigger voltage.

SUMMARY OF THE INVENTION

The present invention is directed to an improved electrostatic discharge clamp. The invention addresses and resolves the need in the art for an improved ESD bus clamp having a high current rating, a small size, and a sufficiently low trigger voltage.

According to one exemplary embodiment, an ESD bus clamp in an integrated circuit comprises an inverter having an input and an output. The ESD bus clamp further comprises a bipolar transistor having a base, an emitter, and a collector, where the base is connected to the output of the inverter, the emitter is connected to a ground of the integrated circuit, and the collector is connected to a power bus of the integrated circuit. The ground, for example, may be connected to a substrate of the integrated circuit and the power bus may be, for example, a Vdd bus. The bipolar transistor, for example, may be a bipolar NPN transistor and may begin shunting current to the ground when an ESD discharge causes a voltage level on the power bus to increase by approximately 1.0 volt.

According to this exemplary embodiment, the ESD bus clamp further comprises a resistor coupling the input of the inverter to the power bus. The resistor, for example, may be a FET having a gate, a drain, and a source, where the gate is coupled to the ground, the source is coupled to the power bus, and the drain is coupled to the input of the inverter. The ESD bus clamp further comprises a capacitor coupling the input of the inverter to ground. The capacitor, for example, may be a FET having a gate, a drain, and a source, where the gate is coupled to the input of the inverter and the drain and source are coupled to ground. Other features and advantages of the present invention will become more readily apparent to those of ordinary skill in the art after reviewing the following detailed description and accompanying drawings.

DETAILED DESCRIPTION OF THE INVENTION

The present invention is directed to an improved electrostatic discharge clamp. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
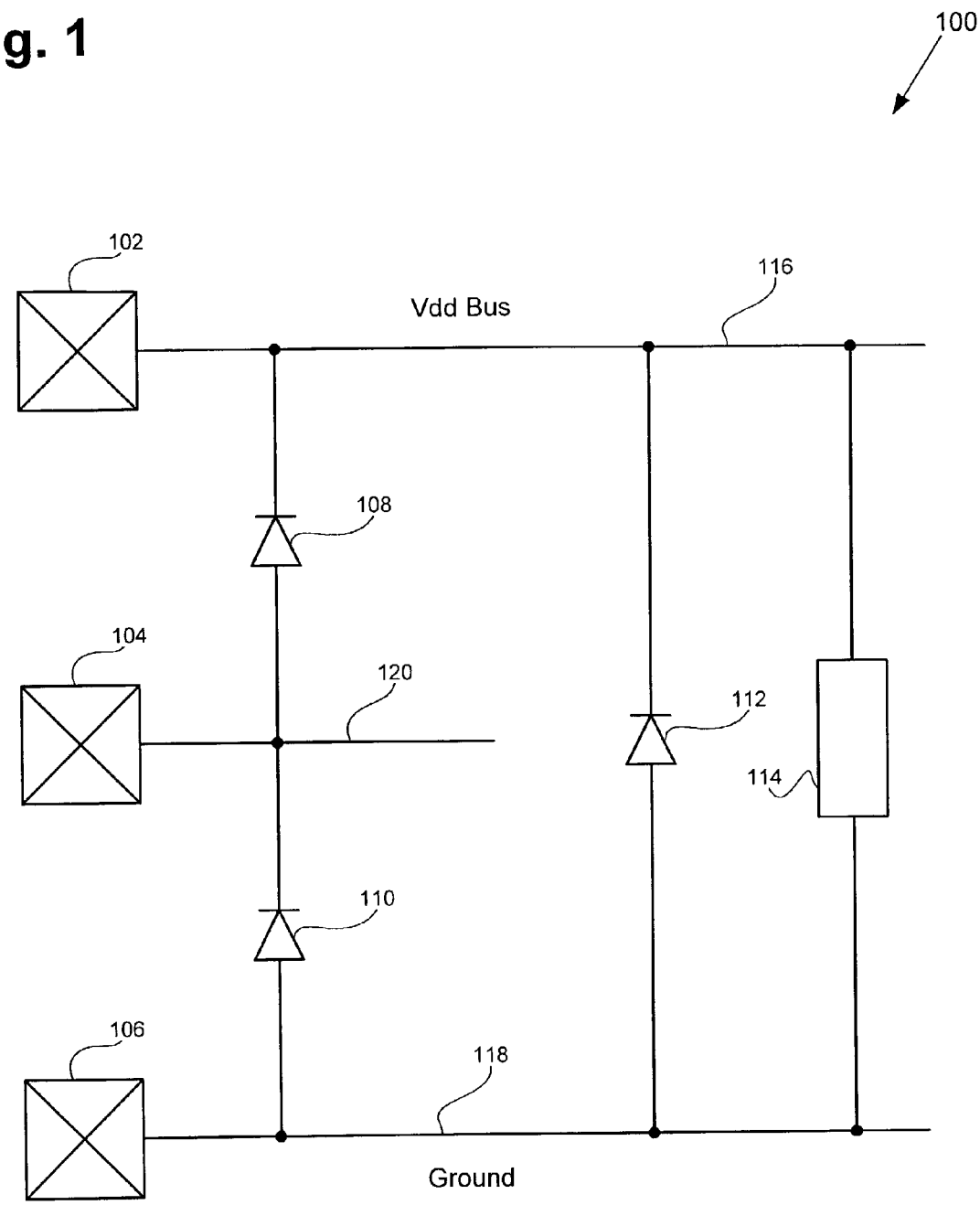
FIG. 1 illustrates a schematic diagram of an exemplary ESD protection circuit in accordance with one embodiment of the present invention.

FIG. 1 shows a schematic diagram of an exemplary ESD protection circuit in accordance with one embodiment of the present invention. ESD protection circuit 100 in FIG. 1 includes power pad 102, signal pad 104, ground pad 106, diodes 108, 110, and 112, ESD bus clamp 114, power bus 116, ground 118, and signal line 120. As shown in FIG. 1, power pad 102 is coupled to power bus 116, which can be a Vdd power supply bus, or Vdd bus, in an IC in the present embodiment. In one embodiment, power bus 116 may be a Vcc power bus. Also shown in FIG. 1, signal pad 104 is connected to signal line 120, which may be, for example, an input, output, or input/output ("I/O") line in an IC.

Further shown in FIG. 1, ground pad 106 is connected to ground 118, which can be connected to the substrate in an IC chip. It is noted that ground 118 is also referred to as "substrate ground" in the present application. Power pad 102, signal pad 104, and ground pad 106, respectively, can be power, signal, and ground bond pads in an IC. In the present embodiment, power pad 102 can be a Vdd pad in an IC. Also shown in FIG. 1, a cathode terminal of diode 108 is connected to power bus 116, i.e. Vdd bus, and an anode terminal of diode 108 is connected to signal line 122. Diode 108 can be, for example, an N-well diode.

Further shown in FIG. 1, a cathode terminal of diode 110 is connected to signal line 120, and an anode terminal of diode 110 is connected to ground 1118, i.e. substrate ground. Diode 110 can be, for example, a substrate diode. Also shown in FIG. 1, a cathode terminal of diode 112 is connected to power bus 116, i.e. Vdd bus, and an anode terminal of diode 112 is connected to ground 118, i.e. substrate ground. Diode 112 can be an N-well diode, which may be formed by utilizing an N-well in a PFET (P-channel Field Effect Transistor) in an IC. Also shown in FIG. 1, ESD bus clamp 114 is connected between power bus 116, i.e. Vdd bus, and ground 118, i.e. substrate ground.

The operation of ESD protection circuit 100 is now discussed. ESD protection circuit 100 protects an IC from positive and negative ESD discharges occurring at signal pad 104 by dissipating the positive or negative ESD discharge to substrate ground. For example, when a positive ESD discharge occurs at signal pad 104, diode 108 becomes forward biased, and a conduction path is provided from signal pad 104 to power bus 116, i.e. Vdd bus. ESD bus clamp 114 provides a conduction path for the positive ESD discharge from power bus 116 to ground 118, i.e. substrate ground. Thus, in the above example, the positive ESD discharge at signal pad 104 is dissipated to substrate ground via forward-biased diode 108 and ESD bus clamp 114.

By way of another example, when a negative ESD discharge occurs at signal pad 104, diode 110 becomes forward biased, and a conduction path is provided from signal pad 104 to substrate ground, i.e. ground 118. Thus, the negative ESD discharge at signal pad 104 is dissipated to substrate ground via forward-biased diode 110.

ESD protection circuit 100 also protects an IC from positive and negative ESD discharges occurring at signal pad 104 by dissipating the positive or negative ESD discharge to substrate ground. For example, when a positive ESD discharge occurs at power pad 102, i.e. Vdd pad, ESD bus clamp 114 provides a conduction path for the positive ESD discharge from power bus 116 to ground 118, i.e. substrate ground. Thus, the positive ESD discharge is dissipated to substrate ground via ESD bus clamp 114. By way of further example, when a negative ESD discharge occurs at power pad 102, diode 112 becomes forward biased and provides a conduction path to dissipate the negative ESD discharge to substrate ground. ESD bus clamp 114 is discussed in detail below in relation to FIGS. 2 and 3.

Figure 2:
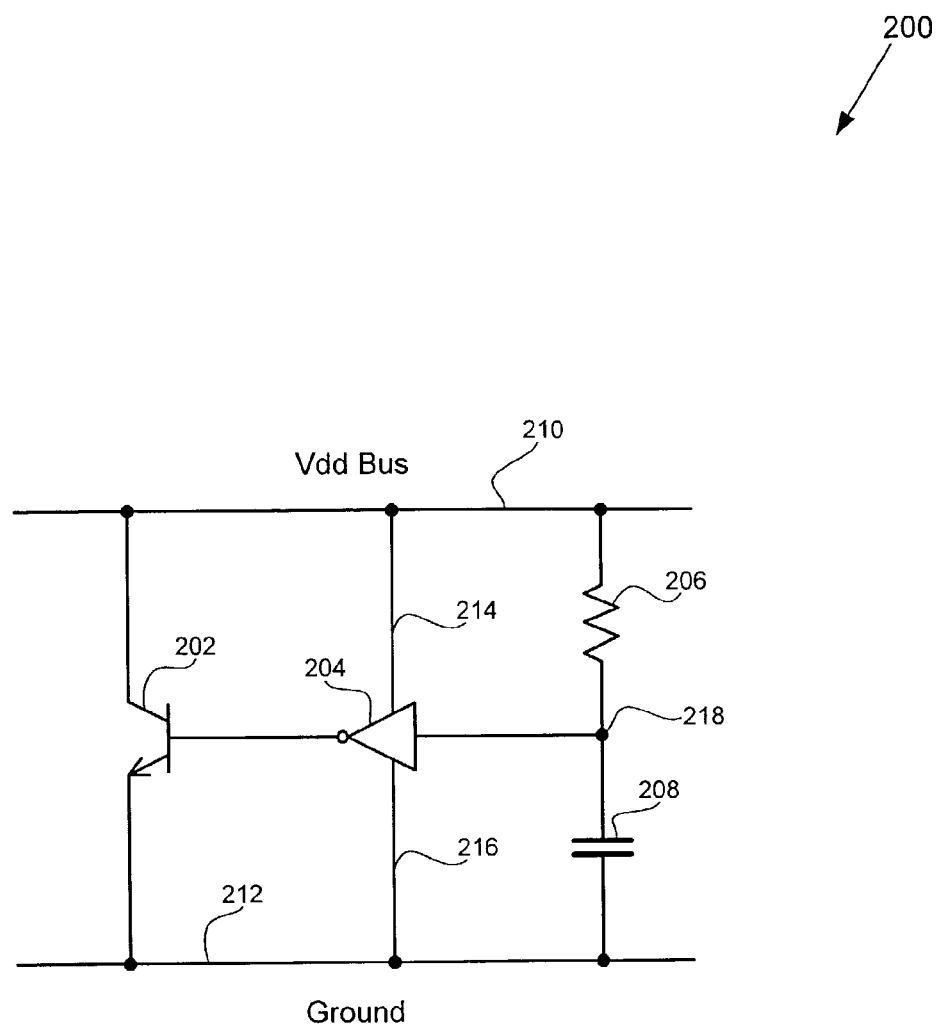
FIG. 2 illustrates a schematic diagram of an exemplary ESD bus clamp in accordance with one embodiment of the present invention.

FIG. 2 shows a schematic diagram of an exemplary ESD bus clamp in accordance with one embodiment of the present invention. ESD bus clamp 200 in FIG. 2 shows one embodiment of the present invention's ESD bus clamp, which is shown in block form as ESD bus clamp 114 in FIG. 1. Power bus 210 and ground 212 in FIG. 2 correspond, respectively, to power bus 116 and ground 118 in FIG. 1. Power bus 210 and ground 212, respectively, are connected to a power pad and a ground pad not shown in FIG. 2, such as power pad 102 and ground pad 106 in FIG. 1. ESD bus clamp 200 in FIG. 2 comprises NPN transistor 202, inverter 204, resistor 206, and capacitor 208.

As shown in FIG. 2, the collector of NPN transistor 202 is connected to power bus 210, i.e. Vdd bus, and the emitter of NPN transistor 202 is connected to ground 212, i.e. substrate ground. NPN transistor 202 can be a high-voltage transistor. Also shown in FIG. 2, an output of inverter 204 is connected to the base of NPN transistor 202 and the input of inverter 204 is connected to node 218. As shown in FIG. 2, inverter 204 is coupled to power bus 210 and ground 212 through lines 214 and 216, respectively. Further shown in FIG. 2, a first end of resistor 206 is connected to node 218 and a second end of resistor 206 is connected to power bus 210, i.e. Vdd bus. Resistor 206 can be, for example, a metal resistor, a PFET, an NFET (N-channel Field Effect Transistor), or other appropriate high impedance resistor as known in the art. In one embodiment, resistor 206 may comprise a PFET having a gate coupled to substrate ground, a source coupled to Vdd bus, i.e. power bus 210, and a drain coupled to node 218.

Also shown in FIG. 2, a first end of capacitor 208 is connected to node 218 and a second end of capacitor 208 is connected to ground 212. Capacitor 208 may comprise an NFET having a gate connected to node 218 and a source, drain, and body connected to ground 212. In another embodiment, capacitor 208 may be a PFET capacitor or other appropriate type of capacitor as known in the art.

The operation of ESD bus clamp 200 is now discussed. ESD bus clamp 200 typically operates in either a first mode, where no power is applied to ESD bus clamp 200, or a second mode, where a steady power supply voltage is present on power bus 210, i.e. Vdd bus. In the first mode, since no power is applied to ESD bus clamp 200, all nodes of ESD bus clamp 200, including Vdd bus, are expected to be at a potential of 0.0 volts. ESD bus clamp 200 operates in the first mode, for example, when an IC chip comprising ESD bus clamp 200 receives an ESD discharge while being handled by a human or machine handler. ESD bus clamp 200 operates in the second mode, for example, when the IC chip comprising ESD bus clamp 200 receives an ESD discharge while the IC chip is powered on.

When ESD bus clamp 200 is operating in the first mode, a positive ESD discharge at a power pad, such as power pad 102 in FIG. 1, coupled to power bus 210 will result in a rapid increase in voltage on power bus 210, i.e. Vdd bus, with respect to ground 212. The rapid increase in voltage on power bus 210 causes inverter 204 to turn on. The time constant delay set by the values of resistor 206 and capacitor 208 holds the input of inverter 204 at an initial condition of 0.0 volts, causing the output of inverter 204 to be at a logical "1." When the voltage level at the output of inverter 204 increases to approximately 0.7 volt, NPN transistor 202 will turn on. In one embodiment, NPN transistor 202 will turn on when the output of inverter 204 increases to approximately 1.0 volt.

As soon as NPN transistor 202 turns on and begins conducting current, NPN transistor 202 will begin to reduce the voltage on power bus 210. As the voltage on power bus 210 increases as a result of the positive ESD discharge, inverter 204 will drive the base of NPN transistor 202 harder. As a result of increased base drive, NPN transistor 202 will shunt more current to ground 212, i.e. substrate ground. After a duration of time determined by a time constant set by the values of resistor 206 and capacitor 208, the output of inverter 204 will flip, i.e. the output of inverter 204 will change from a logical "1" to "0," which will shut off NPN transistor 202.

In one embodiment, NPN transistor 202 will shut off approximately 1.6 microseconds after the start of the ESD discharge, which provides a sufficient amount of time for ESD bus clamp 200 to dissipate an ESD discharge to substrate ground. In one embodiment, the voltage on power bus 210 reaches a peak voltage level of approximately 4.0 volts when NPN transistor 202 shuts off. In one embodiment, NPN transistor 202 can shunt a maximum peak current of approximately 1.25 amperes.

The ability of ESD bus clamp 200 to dissipate an ESD discharge in the first mode of operation may be tested using a method known as the Human Body Model ("HBM"). By way of background, HBM involves simulating the ESD discharge that can occur when an individual touches an IC chip. In the HBM, the human body can be represented by a 100.0 picofarad capacitor, which is charged to a specified voltage and then discharged into the IC chip through a 1500.0 ohm resistor. In one embodiment, ESD bus clamp 200 can shunt a maximum HBM current of 1.25 amperes at 2.0 kilovolts and has a maximum HBM voltage of 5.0 volts at 2.0 kilovolts.

In the second mode of operation, as discussed above, an IC chip comprising ESD bus clamp 200 receives an ESD discharge while the IC chip is powered on and a steady power supply voltage is present on power bus 210. In the second mode of operation, ESD bus clamp 200 operates in a similar manner as discussed above in the first mode of operation. However, in the second mode of operation, NPN transistor 202 will turn on and begin shunting current to ground 212 when an ESD discharge causes the supply voltage level on power bus 210 to increase by approximately 1.0 volt. As discussed above, NPN transistor 202 will continue to shunt current to substrate ground until the expiration of a duration of time determined by a time constant set by the values of resistor 206 and capacitor 208 expires. At the expiration of the above duration of time, the output of inverter 204 will flip from a logical "1" to "0," which will ground the base of NPN transistor 202 and turn it (NPN transistor 202) off. In one embodiment, ESD bus clamp 200 will remain on for approximately 1.6 microseconds after the beginning of an ESD discharge.

Thus, FIG. 2 illustrates an exemplary ESD bus clamp that advantageously begins shunting current after an ESD discharge causes an increase of approximately 1.0 volt on the power bus, i.e. Vdd bus. Furthermore, ESD bus clamp 200 advantageously clamps a 2.0 kV HBM discharge to approximately 5.0 volts, which is sufficient to protect sensitive components on an IC chip from ESD discharge damages.

Figure 3:
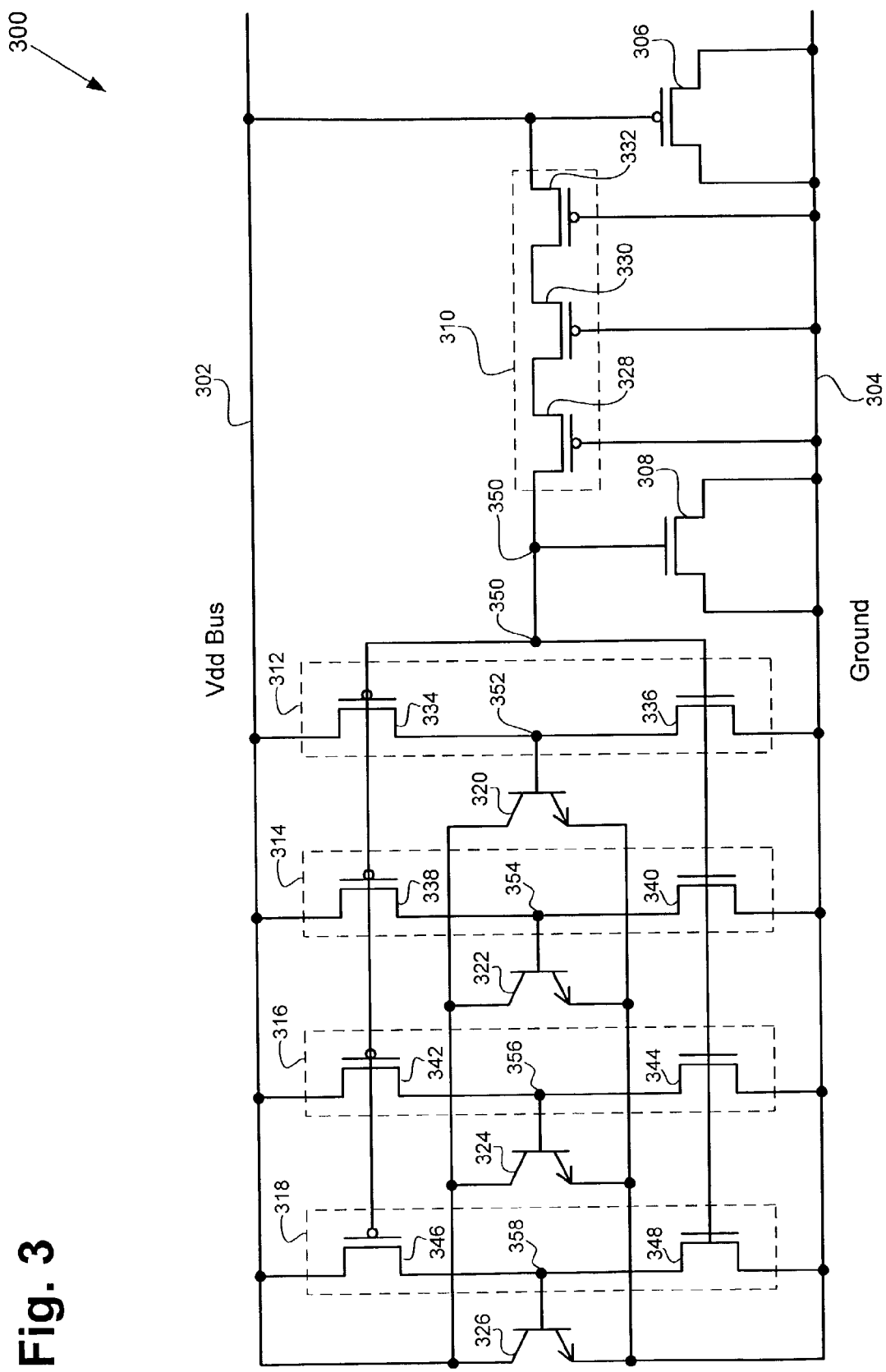
FIG. 3 illustrates a schematic diagram of an exemplary ESD bus clamp in accordance with one embodiment of the present invention.

FIG. 3 shows a schematic diagram of an exemplary ESD bus clamp in accordance with one embodiment of the present invention. ESD bus clamp 300 in FIG. 3 shows another embodiment of the present invention's ESD bus clamp, which is shown in block form as ESD bus clamp 114 in FIG. 1. In contrast to ESD bus clamp 200 in FIG. 2, ESD bus clamp 300 illustrates an embodiment of the present invention having four NPN transistors, which are each driven by a separate inverter. Power bus 302 and ground 304 in FIG. 3 correspond, respectively, to power bus 116 and ground 118 in FIG. 1. ESD bus clamp 300 in FIG. 3 comprises capacitors 306 and 308, resistor 310, inverters 312, 314, 316, and 318, and NPN transistors 320, 322, 324, and 326.

As shown in FIG. 3, capacitor 306 is connected between power bus 302, i.e. Vdd bus, and ground 304, i.e. substrate ground. In the present embodiment, capacitor 306 comprises a PFET having a gate coupled to power bus 302 and a source and a drain coupled to ground 304. In another embodiment, capacitor 306 may be an NFET capacitor or other appropriate type of capacitor as known in the art. Also shown in FIG. 3, resistor 310 is connected between power bus 302 and node 350. In the present embodiment, resistor 310 comprises PFETs 328, 330, and 332 coupled together in series. In particular, the source of PFET 332 is connected to power bus 302 and the drain of PFET 332 is connected to the source of PFET 330. The drain of PFET 330 is connected to the source of PFET 328 and the drain of PFET 328 is connected to node 350. The gates of PFETs 328, 330, and 332 are coupled to ground 304. In other embodiments, resistor 310 can be, for example, a metal resistor, an NFET, or other appropriate high impedance resistor as known in the art.

Further shown in FIG. 3, capacitor 308 is connected between node 350 and ground 304. In the present embodiment, capacitor 308 comprises an NFET having a gate coupled to node 350 and a source and a drain coupled to ground 304. In another embodiment, capacitor 308 may be a PFET capacitor or other appropriate type of capacitor as known in the art. Also shown in FIG. 3, the input of inverter 312 is coupled to node 350 and the output of inverter 312 is coupled to node 352. Inverter 312 comprises PFET 334 coupled in series with NFET 336. In particular, the gates of PFET 334 and NFET 336 are connected to node 350 and the drains of PFET 334 and NFET 336 are connected together at node 352. The source of PFET 334 is coupled to power bus 302 and the source of NFET 336 is coupled to ground 304.

Further shown in FIG. 3, the base of NPN transistor 320 is connected to node 352, i.e. the output of inverter 312, the collector of NPN transistor 320 is connected to power bus 302, and the emitter of NPN transistor 320 is connected to ground 304. Also shown in FIG. 3, the input of inverter 314 is coupled to node 350 and the output of inverter 314 is coupled to node 354. Inverter 314 comprises PFET 338 connected in series with NFET 340. In particular, the gates of PFET 338 and NFET 340 are connected to node 350 and the drains of PFET 338 and NFET 340 are connected together at node 354. The source of PFET 338 is coupled to power bus 302 and the source of NFET 340 is coupled to ground 304.

Also shown in FIG. 3, the input of inverter 316 is coupled to node 350 and the output of inverter 316 is coupled to node 356. Inverter 316 comprises PFET 342 connected in series with NFET 344. In particular, the gates of PFET 342 and NFET 344 are connected to node 350 and the drains of PFET 342 and NFET 344 are connected together at node 356. The source of PFET 342 is coupled to power bus 302 and the source of NFET 344 is coupled to ground 304.

Further shown in FIG. 3, the input of inverter 318 is coupled to node 350 and the output of inverter 318 is coupled to node 358. Inverter 318 comprises PFET 346 connected in series with NFET 348. In particular, the gates of PFET 346 and NFET 348 are connected to node 350 and the drains of PFET 346 and NFET 348 are connected together at node 358. The source of PFET 346 is coupled to power bus 302 and the source of NFET 348 is coupled to ground 304. NPN transistors 320, 322, 324, and 326 can be high-voltage transistors.

In general, the operation of ESD bus clamp 300 is similar to the operation of ESD bus clamp 200 discussed above. Similar to ESD bus clamp 200, ESD bus clamp 300 typically operates in either a first mode, where no power is applied to ESD bus clamp 300, or a second mode, where a steady power supply voltage is present on power bus 302. However, in contrast to ESD bus clamp 200, ESD bus clamp utilizes four NPN transistors, i.e. NPN transistors 320, 322, 324, and 326, which are driven, respectively, by inverters 312, 314, 316, and 318.

When ESD bus clamp 300 is operating in a first mode as discussed above, a positive ESD discharge at a power pad, such as power pad 102 in FIG. 1, coupled to power bus 302 will result in a rapid increase in voltage on power bus 302 with respect to ground 304. The rapid increase in voltage on power bus 302 causes inverters 312, 314, 316, and 318 to turn on. The time constant delay set by the values of resistor 310 and capacitor 308 holds the parallel-coupled inputs of inverters 312, 314, 316, and 318 at an initial condition of 0.0 volts, causing the outputs of inverters 312, 314, 316, and 318 to be at a logical "1." Similar to NPN transistor 202 in FIG. 2, NPN transistors 320, 322, 324, and 326 will turn on when the voltage level at the output of inverters 312, 314, 316, and 318, respectively, increases to approximately 0.7 volts. In one embodiment, NPN transistors 320, 322, 324, and 326, respectively, will turn on when the voltage at the output of inverters 312, 314, 316, and 318 increases to approximately 1.0 volt.

NPN transistors 320, 322, 324, and 326 each turn on and begin shunting current from power bus 302 to ground 304 in a similar manner as NPN transistor 202 in FIG. 2. In one embodiment, NPN transistors 320, 322, 324, and 326 can collectively shunt a maximum peak current of approximately 1.25 amperes. In the present embodiment, four NPN transistors, i.e. NPN transistors 320, 322, 324, and 326, are utilized to shunt current from power bus 302 to ground 304. Thus, each of the four NPN transistors, i.e. NPN transistors 320, 322, 324, and 326, is only required to shunt one fourth of the total current that would be shunted by a single NPN transistor, such as NPN transistor 202 in FIG. 2. Furthermore, an individual inverter, i.e. inverters 312, 314, 316, and 318, drives each of the above four NPN transistors, i.e. NPN transistors 320, 322, 324, and 326, respectively. In the present embodiment, a single NPN transistor, such as NPN transistor 202 in FIG. 2, is effectively divided into four NPN transistor segments, i.e. NPN transistors 320, 322, 324, and 326, which are driven individually by inverters 312, 314, 316, and 318, respectively. As a result, localization of current, which can cause subsequent thermal destruction of a device, is advantageously avoided in the present embodiment. Additionally, by driving each of four NPN transistors, i.e. NPN transistors 320, 322, 324, and 326, by an individual inverter, i.e. inverters 312, 314, 316, and 318, respectively, the present embodiment achieves greater thermal stability than would be achieved by driving all four NPN transistors by a single inverter.

Continuing with the operation of ESD bus clamp 300, as soon as NPN transistors 320, 322, 324, and 326 turn on and begin conducting current, NPN transistors 320, 322, 324, and 326 will begin to reduce the voltage on power bus 302. For example, NPN transistors 320, 322, 324, and 326 may collectively shunt approximately 0.525 amperes of current to ground approximately 300.0 picoseconds after a positive ESD discharge pulse appears on the power bus. After a duration of time determined by the time constant set by the values of resistor 310 and capacitor 308, the output of inverters 312, 314, 316, and 318 will flip from a logical "1" to "0," thereby shutting off NPN transistors 320, 322, 324, and 326, respectively. In one embodiment, the values of resistor 310 and capacitor 308 may be selected to shut off NPN transistors 320, 322, 324, and 326 approximately 1.6 microseconds after the start of the ESD discharge.

In the second mode of operation discussed above, ESD bus clamp 300 operates in a similar manner as ESD bus clamp 200 in FIG. 2.

As discussed above, the present invention's ESD bus clamp advantageously begins shunting current after an ESD discharge causes an increase of approximately 1.0 volt on the power bus, i.e. Vdd bus. In other words, the present invention's ESD bus clamp achieves a trigger voltage of approximately 1.0 volt. In contrast, a conventional ESD threshold clamp triggers, i.e. begins conducting current, at approximately 7.0 volts. Thus, the present invention's ESD bus clamp provides a much greater degree of ESD discharge protection to sensitive IC components than the conventional ESD threshold clamp.

Additionally, by utilizing high power NPN transistors to shunt ESD discharge current to ground, the present invention advantageously achieves an ESD bus clamp having a relatively small size and a high current rating. In contrast, a conventional ESD transient clamp utilizing NFETs to shunt ESD discharge current to ground can require ten times as much area on an IC as the present invention's ESD bus clamp, while achieving a current rating that is only a third as high as the current rating achieved by the present invention. Furthermore, a conventional NFET transient clamp limits 2.0 kV HBM discharge to approximately 15.0 volts, whereas the present invention's ESD bus clamp advantageously clamps a 2.0 kV HBM discharge to approximately 5.0 volts.

Thus, the present invention achieves an ESD bus clamp that effectively protects an IC by providing a high current Vcc bus to ground conduction path for positive ESD discharge.

It is appreciated by the above detailed disclosure that this invention achieves an improved ESD bus clamp having a small size, a high current rating, and a sufficiently low trigger voltage. From the above description of the invention it is manifest that various techniques can be used for implementing the concepts of the present invention without departing from its scope. Moreover, while the invention has been described with specific reference to certain embodiments, a person of ordinary skills in the art would appreciate that changes can be made in form and detail without departing from the spirit and the scope of the invention. For example, although the present application has been described by making specific references to NPN bipolar transistors, other types of transistors, such as PNP bipolar transistors or even heterojunction bipolar transistors, can be used in alternative embodiments of the present invention. As another example, the present invention's ESD bus clamp may comprise more than four NPN transistors and more than four inverters. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an improved electrostatic discharge clamp has been described.

What is claimed is:

1. An ESD bus clamp in an integrated circuit, said ESD bus clamp comprising:
    an inverter having an input and an output;
    a bipolar transistor having a base, an emitter, and a collector, said base being connected to said output of said inverter, said emitter being connected to a ground of said integrated circuit, said collector being directly connected to a power bus of said integrated circuit;
    a resistor coupling said input of said inverter to said power bus;
    a capacitor coupling said input of said inverter to said ground;
    wherein said bipolar transistor shunts current to said ground when an ESD discharge causes a voltage level on said power bus to increase by approximately 1.0 volt, wherein said ESD bus clamp limits an approximately 2.0 kilovolt discharge to approximately 5.0 volts.

2. The ESD bus clamp of claim 1 wherein said ground is connected to a substrate of said integrated circuit.

3. The ESD bus clamp of claim 1 wherein said bipolar transistor is an NPN bipolar transistor.

4. The ESD bus clamp of claim 1 wherein said power bus is a Vdd bus.

5. The ESD bus clamp of claim 1 wherein said resistor comprises at least one FET.

6. The ESD bus clamp of claim 1 wherein said capacitor comprises at least one FET.

7. An ESD bus clamp in an integrated circuit, said ESD bus clamp comprising:
    a plurality of inverters, each of said plurality of inverters having a respective input and a respective output;
    a plurality of bipolar transistors, each of said plurality of bipolar transistors having a base, an emitter, and a collector, said base of said each of said plurality of bipolar transistors being coupled to said respective output of one of said plurality of inverters, said emitter of said each of said plurality of bipolar transistors being coupled to a ground of said integrated circuit, said collector of said each of said plurality of bipolar transistors being directly coupled to a power bus of said integrated circuit, wherein each of said plurality of bipolar transistors is a segment of a single bipolar transistor;
    a resistor coupling said respective input of said each of said plurality of inverters to said power bus;
    a first capacitor coupling said respective input of said each of said plurality of inverters to said ground;
    wherein said plurality of bipolar transistors shunt current to said ground when an ESD discharge causes a voltage level on said power bus to increase by approximately 1.0 volt, wherein said ESD bus clamp limits an approximately 2.0 kilovolt discharge to approximately 5.0 volts.

8. The ESD bus clamp of claim 7 further comprising a second capacitor coupling said power bus to said ground.

9. The ESD bus clamp of claim 7 wherein said ground is connected to a substrate of said integrated circuit.

10. The ESD bus clamp of claim 7 wherein each of said plurality of bipolar transistors is an NPN bipolar transistor.

11. The ESD bus clamp of claim 7 wherein said power bus is a Vdd bus.

12. The ESD bus clamp of claim 7 wherein said resistor comprises at least one FET.

13. The ESD bus clamp of claim 7 wherein said first capacitor comprises at least one FET.

14. The ESD bus clamp of claim 8 wherein said second capacitor comprises at least one FET.

15. The ESD bus clamp of claim 7 wherein said plurality of bipolar transistors comprises NPN bipolar transistors.

16. An ESD protection circuit in an integrated circuit, said ESD protection circuit comprising:
    an ESD bus clamp comprising:
        at least one inverter having an input and an output;
        at least one bipolar transistor having a base, an emitter, and a collector, said base being connected to said output of said at least one inverter, said emitter being connected to a ground of said integrated circuit, said collector being connected to a power bus of said integrated circuit;
        a resistor coupling said input of said at least one inverter to said power bus;
        a capacitor coupling said input of said at least one inverter to said ground;
        a first diode having a cathode terminal connected to said power bus and an anode terminal connected to a signal line in said integrated circuit;
        a second diode having a cathode terminal connected to said signal line and an anode terminal connected to said ground;
        a third diode having a cathode connected to said power bus and an anode connected to said ground.

17. The ESD protection circuit of claim 16 wherein said ground is connected to a substrate of said integrated circuit.

18. The ESD protection circuit of claim 16 wherein said at least one bipolar transistor is an NPN bipolar transistor.

19. The ESD protection circuit of claim 16 wherein said power bus is a Vdd bus.

20. The ESD protection circuit of claim 16 wherein said resistor comprises at least one FET.

21. The ESD protection circuit of claim 16 wherein said capacitor comprises at least one FET.

22. The ESD protection circuit of claim 16 wherein said at least one bipolar transistor shunts current to said ground when an ESD discharge causes a voltage level on said power bus to increase by approximately 1.0 volt.

23. The ESD protection circuit of claim 16 wherein said first diode and said third diode are N-well diodes.

24. The ESD protection circuit of claim 16 wherein said second diode is a substrate diode.

* * * * *